United States Patent [19]

Sanders et al.

[11] 4,402,002

[45] Aug. 30, 1983

[54] RADIATION HARDENED-SELF ALIGNED CMOS AND METHOD OF FABRICATION

[75] Inventors: Thomas J. Sanders; William H. White, both of Indialantic, Fla.

[73] Assignee: Harris Corporation, Melbourne, Fla.

[21] Appl. No.: 190,515

[22] Filed: Sep. 25, 1980

Related U.S. Application Data

[62] Division of Ser. No. 893,929, Apr. 6, 1978, Pat. No. 4,313,768.

[51] Int. Cl.³ .................... H01L 27/02; H01L 23/48; H01L 29/46

[52] U.S. Cl. ........................ 357/42; 357/67; 357/91; 357/65

[58] Field of Search ................ 357/42, 67, 91, 65

[56] References Cited

U.S. PATENT DOCUMENTS

| | | | |
|---|---|---|---|
| 3,567,509 | 3/1971 | Kuiper | 428/428 |
| 3,660,735 | 5/1972 | McDougall | 371/235 R |
| 3,673,471 | 6/1972 | Klein et al. | 317/235 R |
| 3,849,216 | 11/1974 | Salters | 148/187 |
| 3,859,716 | 1/1975 | Tihanyi | 29/571 |
| 3,871,067 | 3/1975 | Bogardus | 29/571 |
| 3,886,583 | 5/1975 | Wang | 357/42 |
| 3,983,620 | 10/1976 | Spadea | 357/42 |
| 4,033,797 | 7/1977 | Dill et al. | 148/187 |
| 4,135,955 | 1/1979 | Gasner et al. | 357/42 |
| 4,151,635 | 5/1979 | Kashkooli et al. | 29/571 |
| 4,240,093 | 12/1980 | Dingwall | 357/42 |

FOREIGN PATENT DOCUMENTS 50-81177 6/1975 Japan .

*Primary Examiner*—Andrew J. James
*Attorney, Agent, or Firm*—Leitner, Palan, Martin and Bernstein

[57] ABSTRACT

A radiation hardened CMOS formed by applying a radiation hard gate oxide layer on a silicon substrate, applying silicon doped aluminum gates on the gate oxide, and by ion implanting and annealing source and drain regions using said gates as masks at a temperature of or below 500 degrees centigrade. Using an N⁻ type substrate, a P⁺ guard ring is formed at the interface of the P⁻ well of the N channel MOS device and the N⁻ substrate before the formation of the gate oxide.

4 Claims, 5 Drawing Figures

RADIATION HARDENED-SELF ALIGNED CMOS AND METHOD OF FABRICATION

This is a divisional of application Ser. No. 893,929, filed Apr. 6, 1978, now U.S. Pat. No. 4,313,768 issued Feb. 2, 1982.

BACKGROUND OF THE INVENTION

The present invention relates generally to CMOS devices and more specifically to a radiation hardened CMOS device and method of fabrication.

Radiation hardened devices require that the structure of the MOS devices be unaffected by radiation bombardment. In MOS devices, the gate oxide is most susceptible to alteration by radiation bombardment. Similarily, the surface of the substrate forming the channel region between the source and drains is susceptible to inversion by radiation bombardment. The process for the formation of CMOS devices generally use polysilicon gates and open tube deposition and diffusion of sources and drains at high temperatures. The high temperatures cause impurities to diffuse from the polysilicon gate into and through the gate oxide and thus reduces the radiation hardness of the thin gate oxide layer under the gate material.

The use of an aluminum gate electrode is well known in the prior art as well as the problems of the interface between the aluminum and silicon substrates. As discussed in U.S. Pat. No. 3,567,509, the interaction between aluminum and silicon can be alleviated by doping the aluminum with a small percentage of silicon. The application of this principle to aluminum gate CMOS devices is illustrated in U.S. Pat. Nos. 3,871,067 and 3,886,583. Although these patents deal specifically with silicon doped aluminum, they do not incorporate the use of the silicon doped aluminum gate as a mask to achieve self-alignment of the source and drain regions. In the later two patents, the silicon doped aluminum is formed and delineated after the formation of the source and drain regions. The formation of the source and drain regions using the silicon doped aluminum as a mask for alignment raises problems in the prior art in that the temperature of the deposition and diffusion must be maintained below the eutectic temperature of silicon-aluminum to minimize and prevent interaction between the silicon doped aluminum gate and the silicon areas.

Thus there exists a need for a method of fabricating radiation hardened CMOS devices having silicon doped aluminum gates using the self-aligned gate techniques.

SUMMARY OF THE INVENTION

The present invention is a method of fabricating radiation hardened self-aligned CMOS devices using a silicon doped aluminum gate. The method of fabrication begins with forming a P type well region in an N type substrate followed by the formation of P+ guard rings in the P type well. Radiation hardened gate oxide is then formed over the P type well and a second region of the N type substrate. A silicon doped aluminum gate electrode is then formed on each of the gate oxide layers. The source and drain regions of the CMOS devices are then formed by ion implantation and annealing using the silicon doped aluminum gates as masks in a self-alignment technique. The ion implantation and annealing is performed at temperatures at of or below 500 degrees centigrade. An insulative layer is formed over the substrate and the gate and apertures are formed to provide contacts to the source and drain regions. Metal interconnects are then applied and delineated. The resulting structure is a CMOS structure having a gate electrode of 1 to 3 percent silicon and 99 to 97 percent aluminum respectively with source and drains aligned relative to the gate electrodes. The gate oxide is radiation hardened and inversion is prevented by the P+ guard ring for the N channel MOS devices.

OBJECTS OF THE INVENTION

An object of the present invention is to provide an improved radiation hardened CMOS devices.

Another object of the present invention is to provide a method of fabricating radiation hardened CMOS devices.

A further object of the present invention is to produce CMOS devices having silicon doped aluminum gate and using self-aligned gate techniques.

Other objects, advantages, and novel features of the invention will become apparent from the following detailed description of the invention when considered in conjunction with the accompanying drawings.

DESCRIPTION OF THE PREFERRED EMBODIMENTS

The object of the present invention is to increase the radiation hardness and A.C. performance of self-aligned CMOS devices. This objective is accomplished by replacing the conventional polycrystalline silicon gates with silicon doped aluminum gates, ion implating the source and drain regions, and by a heavy P+ doped guard ring around the N channel MOS devices.

Silicon doped aluminum gate material is advantageous since it is deposited at a very low temperature below the 577 degrees centigrade eutectic temperature of silicon-aluminum and thus will not specifically react to the silicon dioxide or the silicon. Similarily, silicon doped aluminum of is very low resistance with no impurity doping and thus increases A.C. performance. These factor means that the radiation hardeness properties of the gate oxide under the gate material are not disturbed and maximum radiation tolerance is achieved. This is not true for polysilicon gate materials because the polysilicon gate is deposited at high temperatures and doped with impurities which can diffuse through the gate oxide and destroy the radiation hardeness of the MOS device.

In the self-aligned gate technique of fabrication, the gate material must be applied first and used as a mask for the formation of the source and drain regions. By ion implanting impurities to form the source and drain regions at 25 degrees centigrade and annealing about 500 degrees centigrade, the silicon doped aluminum gate nor the radiation hardened properties of the gate oxide are disturbed. Similarly, ion implantation forms more perfectfly aligned structures since there is essentially no side diffusion of the impurities during the implantation or subsequent annealing. The heavily doped P+ guard ring employed around all N channel MOS devices stops the post radiation inversion of the field oxide of the parasitic N channel MOS devices which would otherwise degrade the over all radiation hardness of the device.

Figure 1:
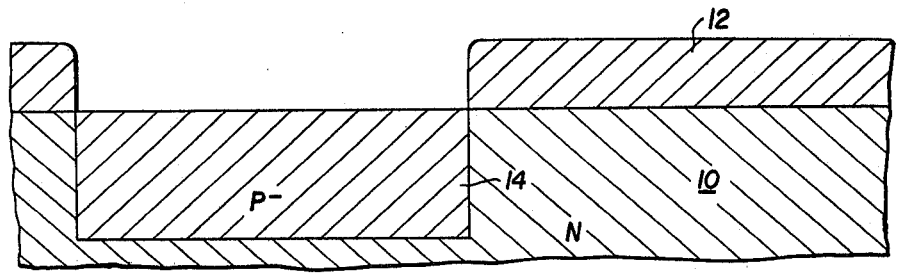
FIGS. 1–5 are cross-sectional views of a semiconductor structure illustrating the method of fabricating the radiation hardened CMOS devices according to the principles of the present invention.

The preferred method of fabrication of improved radiation hardened CMOS devices to accomplish the objects using the principles just mentioned will now be described. As illustrated in FIG. 1, a substrate or wafer 10 preferably N-type having, for example, $1 \times 10^{15}$ carriers per cubic centimeter is masked by an insulative layer, for example, silicon dioxide 12 to form a P− well 14 having, a depth of approximately 3 microns and an impurity concentration of $5 \times 10^{15}$ carriers per cubic centimeter, for example. The well 14 is formed either by deposition and diffusion or ion implantation and diffusion of, for example, boron impurities.

Figure 2:
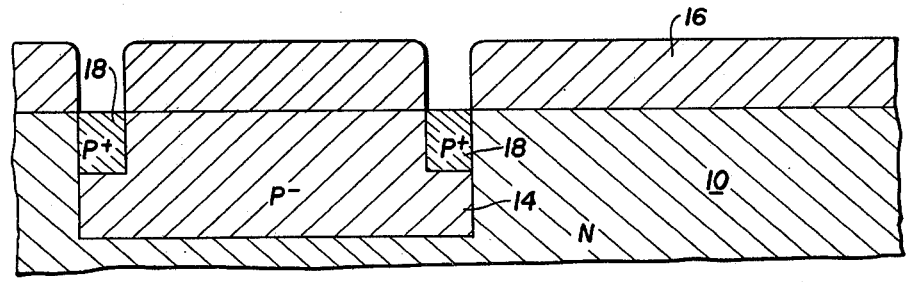

Additional silicon dioxide layer 16 is formed and delineated by, for example, photoresist techniques to form a mask having openings therein through which the P+ guard rings 18 is formed for N channel devices. Guard ring 18 may be formed by deposition and diffusion or ion implantation and diffusion of boron impurities, for example, to produce a guard ring 18 having impurity concentration, for example, $1 \times 10^{19}$ per cubic centimeter and at a depth of, for example, 2 microns. Since the P+ guard ring 18 is provided to stop the post radiation inversion of the field oxide of the N channel MOS device to be formed in well 14, impurity concentration must be substantially greater than the impurity concentration of the substrate 10. The resulting structure is illustrated in FIG. 2.

A new silicon dioxide layer 19 is formed and delineated to provide the openings which define the surface region of the CMOS devices. A layer of radiation hardened gate oxide is formed over the delineated areas of P− well 14 and substrate 10 by oxidation at 1000 degrees centigrade in dry dioxide. The resulting layer is illustrated as gate oxide layers 20 and 22 in FIG. 3 having a thickness of 600 angstroms, for example. Gate electrodes 24 and 26 are then formed on the oxide layer 20 and 22 as silicon doped aluminum by low energy sputtering, for example, at 200 degrees centigrade. The silicon doped aluminum electrodes may also be formed either by deposition as described in U.S. Pat. No. 3,576,509 or by applying the aluminum gate material and ion implanting silicon impurities as described in U.S. Pat. No. 3,871,067. Whatever technique is used the importance is that the temperature during the formation is not within the area of 577 degrees centigrade eutectic temperature of silicon-aluminum. Preferrably the steps are carried out at or below 500 degrees centigrade and form a gate of 1 to 3 percent silicon and 99 to 97 percent aluminum, respectively. The percentage of silicon to aluminum by weight may be varied, but should be no less than one percent.

Figure 3:
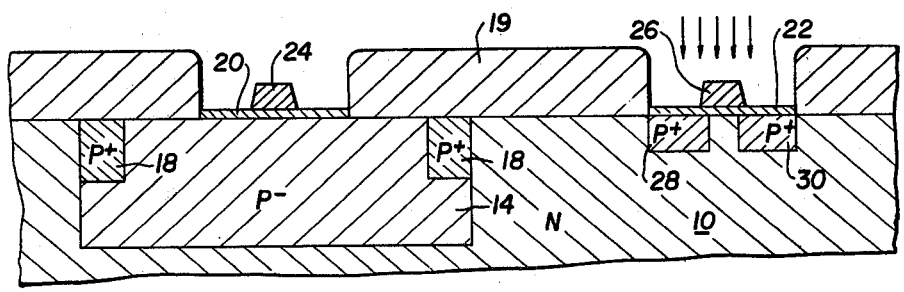
Figure 4:
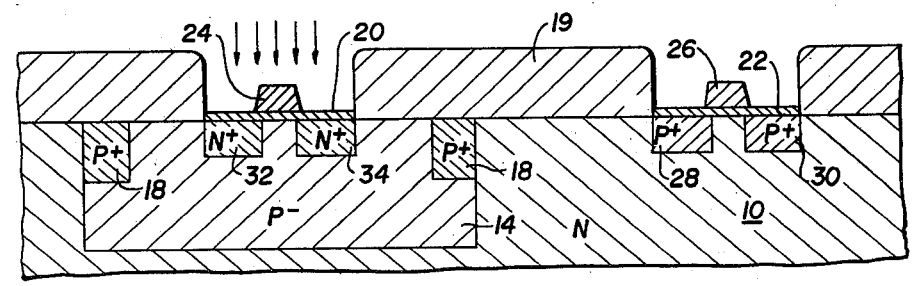

Once gate electrodes 24 and 26 are formed, they are used as masks in a self-alignment technique to form the source and drain regions of the CMOS devices. As illustrated in FIG. 3, ion implantation of, for example, boron through the gate oxide 22 using gate electrode 26 is conducted at 25 degrees centigrade and annealed at 500 degrees centigrade to produce P+ type source and drain regions 28 and 30, for example, of a depth of 1 micron and an impurity concentrate of, for example, $1 \times 10^{19}$ carriers per cubic centimeter. As illustrated in FIG. 4, N+ type source and drain regions 32 and 34 of the N channel device are formed by ion implantating, for example, phosphorus through the gate oxide region 20 using gate electrode 24 as an alignment mask at 25 degrees centigrade and annealed at 500 degrees centigrade to produce source and drain regions of a depth of approximately 1 micron and having an impurity concentration of for example, $1 \times 10^{20}$ carriers per cubic centimeter. The formation of the source and drain regions 28, 30, 32 and 34 is performed using ion implantion and annealing at temperatures of or below 500 degrees centigrade to insure the radiation hardness of the gate oxide 20 and 22 by preventing any degradation of the gate oxide layer 20 and 22 by silicon-aluminum interaction.

Figure 5:
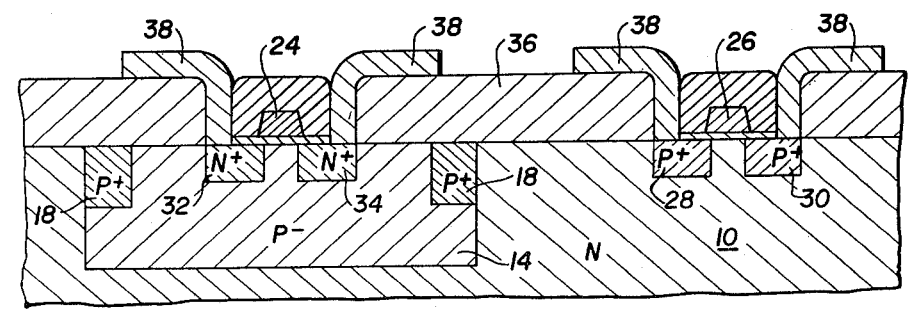

Standard techniques are used to form the field oxide 36 covering the substrate and the gates 24 and 26, to form contact apertures therein and to deposit and delineate of the metal interconnects 38 which, for example, are aluminum. The final structure is shown in FIG. 5.

From the preceding description of the preferred embodiments, it is evident that the objects of the invention are attained in that a radiation hardened CMOS device using self-aligned silicon doped aluminum gate techniques has been fabricated. Although the invention has been described and illustrated in detail, it is to be clearly understood that the same is by way of illustration and example only and is not to be taken by way of limitation. The specific percentages of silicon doped aluminum may vary but should not be less than 1 percent or greater than 10 percent. Impurities other than boron and phosphorus may be used to form the doped regions in the substrate as well as resulting in doped regions of different impurity concentrations. The importance is the relative impurity concentrations of the doped regions to produce required electrical characteristics. Similarly, the formation of the source and drain regions 32 and 34 may precede the formation of source and drain regions 28 and 30. The spirit and scope of the present invention is to be limited only by the terms of the appended claims.

What is claimed:

1. A pair of CMOS devices having self-aligned gates comprising:
    a silicon substrate of a first conductivity type;
    a first region of a second conductivity type opposite said first impurity type formed in said substrate;
    a layer of a silicon oxide forming the gate oxide over a portion of said substrate and of said first region;
    a silicon doped aluminum gate on said silicon oxide layer over each of said portions;
    ion implanted source and drain region of said first impurity type in said first region having adjacent edges vertically aligned with the edges of its respective gate; and
    ion implanted source and drain regions of said second impurity type in said portion of said substrate having adjacent edges vertically aligned with the edges of its respective gate.

2. The CMOS devices according to claim 1 wherein said gate is between one and three percent silicon and ninety-nine to ninety-seven percent aluminum.

3. The CMOS devices according to claim 1 wherein said substrate is N conductivity type and said first region is P conductivity type; and including a guard ring of P conductivity type at the surface interface of said substrate, guard ring having a greater impurity concentration than said substrate.

4. The CMOS devices, according to claim 1 including a second silicon oxide layer over said substrate and said gate and aluminum interconnects extending through apertures in said second silicon oxide layer to said source and drain regions.

* * * * *